(12) United States Patent
Otoshi et al.

(10) Patent No.: US 7,276,954 B2
(45) Date of Patent: Oct. 2, 2007

(54) DRIVER FOR SWITCHING DEVICE

(75) Inventors: Kota Otoshi, Kariya (JP); Sadanori Suzuki, Kariya (JP)

(73) Assignee: Kabushiki Kaisha Toyota Jidoshokki, Kariya-shi (JP)

( * ) Notice: Subject to any disclaimer, the term of this patent is extended or adjusted under 35 U.S.C. 154(b) by 434 days.

(21) Appl. No.: 10/607,481

(22) Filed: Jun. 25, 2003

(65) Prior Publication Data

US 2004/0036511 A1 Feb. 26, 2004

(30) Foreign Application Priority Data

Jun. 26, 2002 (JP) ............................. 2002-186465
Jun. 26, 2002 (JP) ............................. 2002-186466

(51) Int. Cl.
*H03K 17/56* (2006.01)

(52) U.S. Cl. ...................... 327/423; 327/424; 327/108; 327/109; 327/110; 327/111; 327/112

(58) Field of Classification Search ........ 327/108–112, 327/423, 424; 363/40, 56.01, 56.02, 98, 363/132; 326/82, 83, 84, 85, 86, 87, 88, 326/90; 324/765; 345/61, 161; 323/274; 330/255

See application file for complete search history.

(56) References Cited

U.S. PATENT DOCUMENTS 3,603,818 A * 9/1971 White ........................ 327/165
4,859,870 A    8/1989 Wong et al. ................ 307/263
5,424,683 A *  6/1995 Takahashi ................... 330/255
5,430,400 A *  7/1995 Herlein et al. .............. 327/108
5,598,107 A    1/1997 Cabuk .......................... 326/27
5,751,978 A *  5/1998 Tipple ......................... 710/305
5,773,999 A    6/1998 Park et al. ................... 327/108
5,864,584 A *  1/1999 Cao et al. .................... 375/244
5,940,287 A *  8/1999 Brkovic ....................... 363/127
6,175,359 B1 * 1/2001 Marten ........................ 345/161
6,184,663 B1 * 2/2001 Imai et al. ................... 323/274
6,292,010 B1 * 9/2001 Persons et al. .............. 324/765
6,563,352 B1 * 5/2003 Gohel et al. ................ 327/108
6,756,842 B2 * 6/2004 Mehr et al. ..................... 330/9
6,812,618 B2 * 11/2004 Hayashi ................... 310/316.01
6,873,141 B1 * 3/2005 Seyfang et al. ............. 323/286
6,946,891 B2 * 9/2005 Asano et al. ................ 327/318

* cited by examiner

*Primary Examiner*—Tuan T. Lam
*Assistant Examiner*—Hiep Nguyen
(74) *Attorney, Agent, or Firm*—Morgan & Finnegan, L.L.P.

(57) ABSTRACT

A driver for a switching device has a plurality of driver circuits for driving the switching device and a control circuit. The control circuit selectively operates the driver circuits in response to a plurality of predetermined drive modes. Alternatively, a driver for a switching device has a driver circuit and a control circuit. The driver circuit is connected to a plurality of power sources. Each of the power sources has a different voltage. The control circuit selects one of the power sources for operating the driver circuit in response to a plurality of predetermined drive modes.

22 Claims, 7 Drawing Sheets

DRIVER FOR SWITCHING DEVICE

BACKGROUND OF THE INVENTION

The present invention relates to a driver for a switching device.

A driver for driving a switching device, such as a metal-oxide-semiconductor field-effect-transistor (a "MOSFET"), a bipolar transistor and an insulated gate bipolar transistor (an "IGBT"), is widely used for an inverter and a switching source. Referring to FIGS. 4 and 10, for example, in a switching circuit, as a driver 10 supplies an electric charge to a control terminal or a gate 11g of a switching device 11 so as to increase a control voltage Vgs above a predetermined value, electric current Id passes between a drain 11d and a source 11s. On the other hand, as the driver 10 draws an electric charge from the control terminal 11g so as to decrease the control voltage Vgs below another predetermined value, the switching device 11 turns off. Thus, the electric current Id is controlled by regulating the control voltage Vgs.

When the control voltage Vgs varies rapidly, a voltage surge is occurred between the drain 11d and the source 11s mainly due to an inductance component L of a load circuit. As a result, the switching device itself collapses or electromagnetic noise is generated to affect external electronic instruments.

In the prior art, to regulate a voltage surge, an electrical resistance R having an appropriate value of resistance is connected to the control terminal 11g so that the control voltage Vgs slowly varies when switching is performed. Incidentally, as the value of the electrical resistance R is greater, the control voltage Vgs varies more slowly.

When the greater value of the electrical resistance R which is connected to the control terminal 11g is applied, the voltage surge is more effectively regulated. However, a switching loss on the switching device 11 which turns into heat also increases so as to cause troublesome. That is, the voltage surge regulation and the heat generation have a trade-off relation with each other.

Meanwhile, depending on a usage of the switching device, there may be various operation status. Some mainly regulate electromagnetic noise while permitting the heat generation to a certain extent, or the others mainly regulate the heat generation while permitting the electromagnetic noise to a certain extent. In this state, the value of the electrical resistance R is previously configured in such a manner that both the electromagnetic noise and the heat generation are in a permissible range in all operation conditions. Therefore, the degree of freedom on design is limited, and the resistance value is difficult to select so as to perform inherent function of the switching device. Accordingly, there is a need for a driver for a switching device to widen the degree of freedom on design.

SUMMARY OF THE INVENTION

In accordance with the present invention, a driver for a switching device has a plurality of driver circuits for driving the switching device and a control circuit. The control circuit selectively operates the driver circuits in response to a plurality of predetermined drive modes.

Alternatively, in accordance with the present invention, a driver for a switching device has a driver circuit and a control circuit. The driver circuit is connected to a plurality of power sources. Each of the power sources has a different voltage. The control circuit selects one of the power sources for operating the driver circuit in response to a plurality of predetermined drive modes.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention together with objects and advantages thereof, may best be understood by reference to the following description of the presently preferred embodiments together with the accompanying drawings in which:

DETAILED DESCRIPTION OF THE PREFERRED EMBODIMENTS

A first preferred embodiment of the present invention will now be described with reference to FIGS. 1 through 3. The first preferred embodiment employs a driver for driving an H bridge circuit of an alternating-current inverter or an AC inverter.

Figure 1:
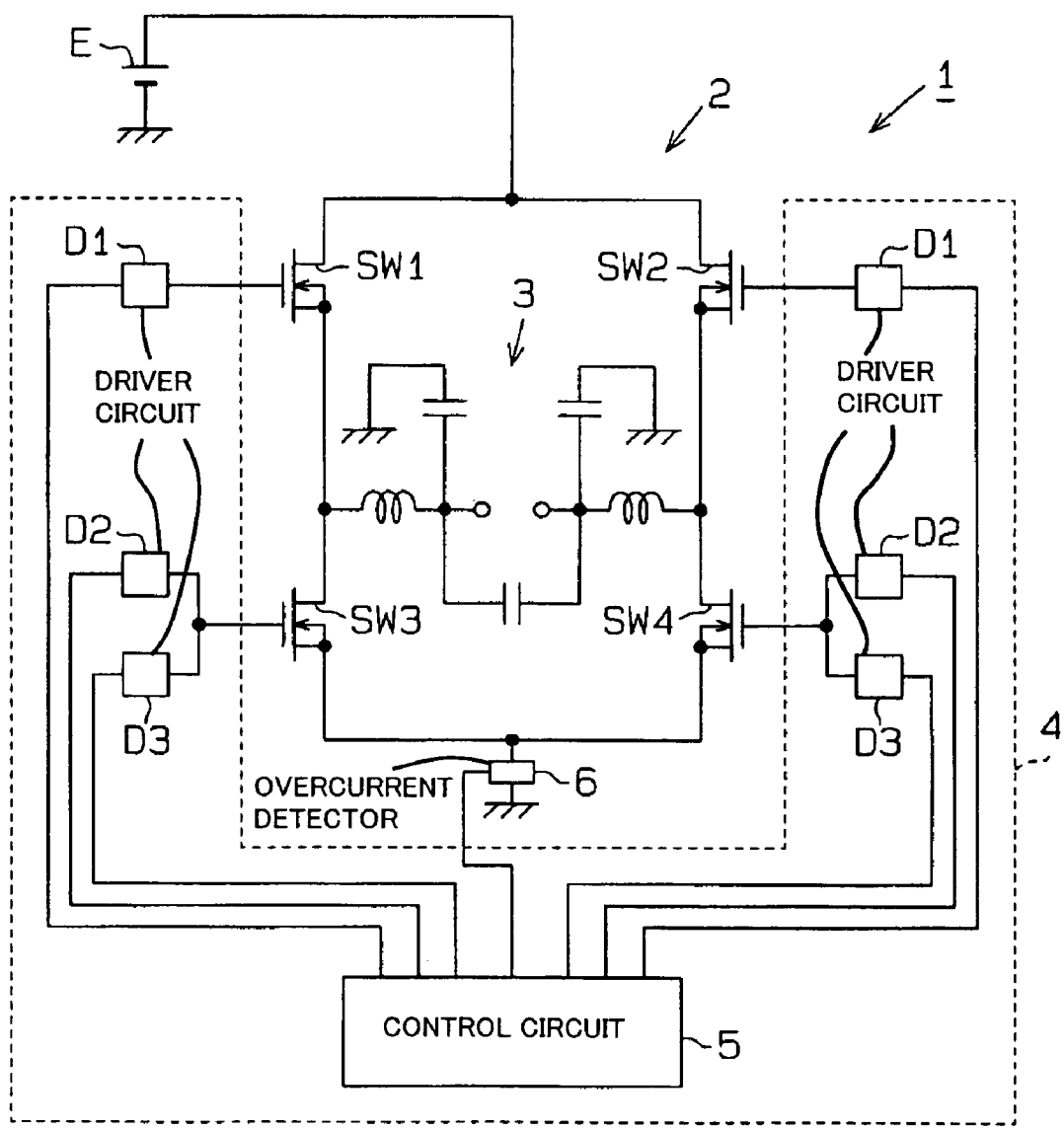
FIG. 1 is a circuit diagram of an AC inverter according to a first preferred embodiment of the present invention.

Now referring to FIG. 1, the diagram illustrates a circuit diagram of an AC inverter 1 according to the first preferred embodiment of the present invention. The AC inverter 1 includes switching devices SW1, SW2, SW3 and SW4, an H bridge circuit 2, a driver 4 and an overcurrent detector 6. The H bridge circuit 2 is connected to a direct-current power source or a DC power source E. Each of the switching devices SW1 through SW4 employs an N-channel metal-oxide-semiconductor field-effect-transistor (an "N-channel MOSFET"). The switching devices SW1, SW2 are connected to the positive side of the DC power source E in the switching devices of the H bridge circuit 2. Each drain of the switching devices SW1, SW2 is connected to a positive terminal of the DC power source F, and each source of the switching devices SW1, SW2 is connected to an output circuit 3. The switching devices SW3, SW4 are connected to the ground in the switching devices of the H bridge circuit 2. Each drain of the switching devices SW3, SW4 is connected to the output circuit 3, and each source of the switching devices SW3, SW4 is connected to the ground through an overcurrent detector 6. Filter components, such as an electrolytic condenser and a reactor, are included in the output circuit 3. The H bridge circuit 2 basically outputs alternating voltage from the output circuit 3 by alternately switching ON-OFF of the pair of switching devices SW1, SW3 and the pair of switching devices SW2, SW4.

The driver 4 includes driver circuits D1, D2, D3 and a control circuit 5. Outputs of the driver circuits D1 are respectively connected to gates or control terminals of the switching devices SW1, SW2. Outputs of the driver circuits D2, D3 are respectively connected in parallel to gates or control terminals of the switching devices SW3, SW4. An output of the control circuit 5 is connected to the respective driver circuits D1, D2, D3.

The control circuit 5 includes a microcomputer (not shown) which stores two drive modes, a normal drive mode and a current limit mode, for the switching devices SW3, SW4, while the microcomputer stores only one drive mode, a normal drive mode, for the switching devices SW1, SW2. The control circuit 5 is connected to the overcurrent detector 6.

Figure 2:
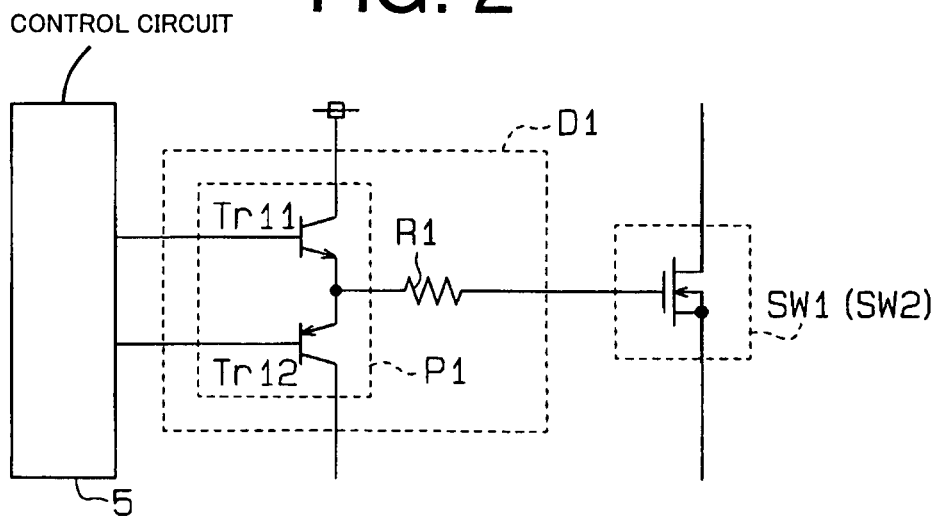
FIG. 2 is a diagram of a driver circuit for a switching device SW1 or SW2 according to the first preferred embodiment of the present invention.

FIG. 2 illustrates the driver circuit D1 for the switching device SW1 or SW2 according to the first preferred embodiment of the present invention. The driver circuit D1 includes a push-pull circuit P1 and an electrical resistance R1. One terminal of the electrical resistance R1 is connected to the control terminal or the gate of the switching device SW1 or SW2, and the other terminal is connected to an output terminal of the push-pull circuit P1.

Figure 3:
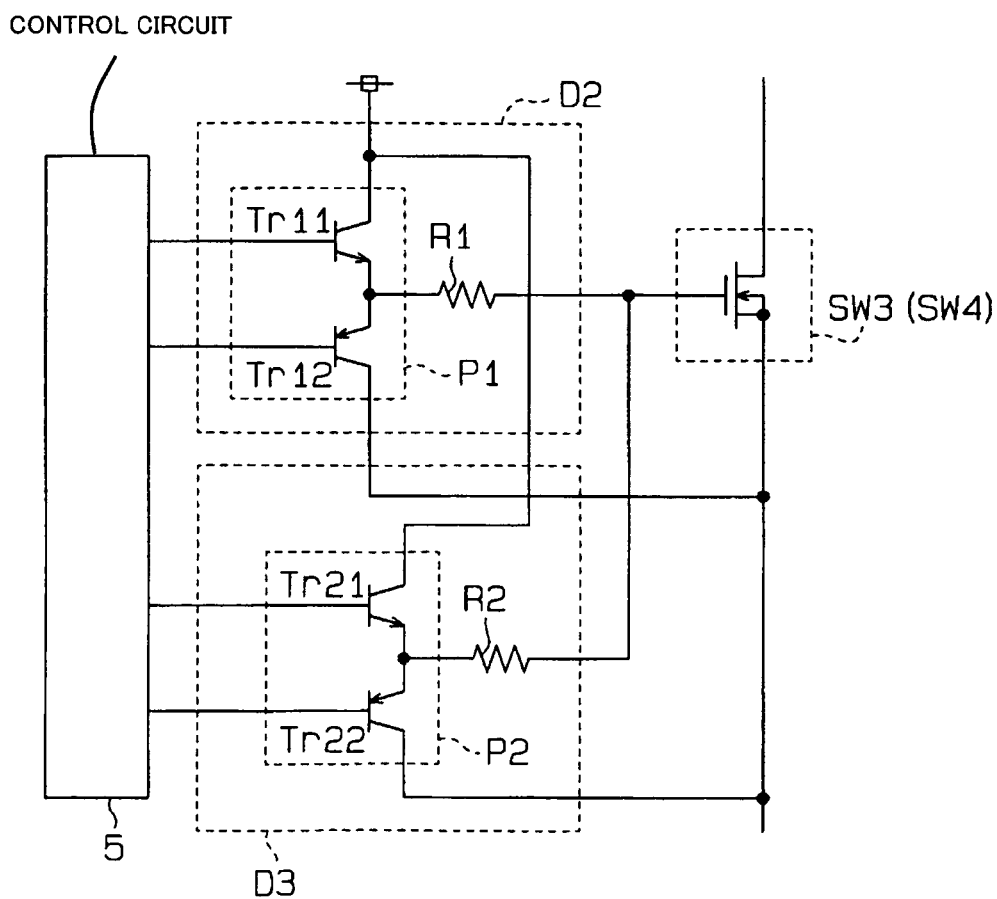
FIG. 3 is a diagram of driver circuits for a switching device SW3 or SW4 according to the first preferred embodiment of the present invention.

FIG. 3 illustrates the driver circuits D2, D3 for the switching device SW3 or SW4 according to the first preferred embodiment of the present invention. The driver circuit D2 includes the same components as the driver circuit D1. One terminal of the electrical resistance R1 is connected to the control terminal of the switching device SW3 or SW4, and the other terminal is connected to an output terminal of the push-pull circuit P1. The driver circuit D3 includes a push-pull circuit P2 and an electrical resistance R2. One terminal of the electrical resistance R2 is connected to the control terminal of the switching device SW3 or SW4, and the other terminal is connected to an output terminal of the push-pull circuit P2. The electrical resistance R2 has a smaller resistance value than the electrical resistance R1. The value of the electrical resistance R1 is configured to minimize emitting electromagnetic noise as far as heat generation is in a permissible range, in a normal drive mode that is regulated by a control frequency of 50 to 60 Hz. The value of the electrical resistance R2 is configured to minimize heat generation as far as electromagnetic noise is in a permissible range. In a current limit mode that is regulated by a control frequency of approximately 40 kHz.

The push-pull circuit generally includes two transistors. When the push-pull circuit is used as a driver circuit of a switching device, top side transistor is operated to supply an electric charge to the control terminal of the switching device and bottom side transistor is operated to draw an electric charge from the control terminal of the switching device. In the first preferred embodiment, the push-pull circuit P1 includes an npn transistor Tr11 and a pnp-transistor Tr12. Similarly, the push-pull circuit P2 includes an npn-transistor Tr21 and a pnp-transistor Tr22.

The operation of the above-configured embodiment will now be described. Referring back to FIG. 1, in the first preferred embodiment, the control circuit 5 has the normal drive mode and the current limit mode for driving the switching devices SW3, SW4 and switches the modes in response to the control frequency. The control frequency means a frequency for driving the switching devices SW1 through SW4. The switching normally operates in the normal drive mode. On the other hand, the switching device prevents collapse of a circuit due to high current and supplies electric current with predetermined value without completely stopping output. In the first preferred embodiment, the control frequency in the normal drive mode ranges from 50 to 60 Hz as well as commercial alternating current. The control frequency in the current limit mode is approximately 40 kHz. The switching device operates overwhelmingly in the normal drive mode and rarely operates in the current limit mode which is only used in emergency.

The normal drive mode will now be described. Still referring to FIG. 1, when the overcurrent detector 6 does not output an overcurrent signal to the control circuit 5, the control circuit 5 operates the driver circuits D2, D3 in the normal drive mode. In other words, the switching devices SW3, SW4 are operated at the control frequency of 50 to 60 Hz. Incidentally, the switching devices SW1, SW2 are also operated at the control frequency of 50 to 60 Hz.

In the normal drive mode, the control circuit 5 sends an ON-OFF control signal to the driver circuit D2 for the switching devices SW3, SW4 and also sends an ON-OFF control signal to the driver circuit D1 for the switching devices SW1, SW2.

The ON-OFF control signal for the normal drive mode will now be described. The control circuit 5 simultaneously switches the switching devices SW1, SW4 to an ON-state in response to the control frequency, while it simultaneously switches the switching devices SW2, SW3 to an OFF-state. The control circuit 5 at the next period simultaneously switches the switching devices SW1, SW4 to an OFF-state, while it simultaneously switches the switching devices SW2, SW3 to an ON-state. Namely, the set of switching devices SW1, SW4 and the set of switching devices SW2, SW3 alternately switch on and off. As a result, the direct current of the direct current power source E is converted to alternating current, and the alternating current is output through a filter of the output circuit 3.

TABLE 1 shows a control matrix of the transistors Tr11, Tr12 of the driver circuit D2 and Tr21, Tr22 of the driver circuit D3 for each of the switching devices SW3, SW4.

TABLE 1

| DRIVER CIRCUIT | | D2 | | D3 | |
| --- | --- | --- | --- | --- | --- |
| TRANSISTOR | | Tr11 | Tr12 | Tr21 | Tr22 |
| SWITCHING DEVICE SW3, SW4 | ON | ON | OFF | OFF | OFF |
| | OFF | OFF | ON | OFF | OFF |

Now referring to TABLE 1 and FIG. 3, when the switching device SW3 is switched to an ON-state, the transistor Tr11 turns on while the transistor Tr12 turns off. Thus, electric charge is supplied to the control terminal of the switching device SW3 through the electrical resistance R1. When the switching device SW3 is switched to an OFF-state, the transistor Tr11 turns off while the transistor Tr12 turns on. Thus, electric charge is drawn from the control terminal of the switching device SW3 through the electrical resistance R1. The transistors Tr21, Tr22 are off in the normal drive mode. Incidentally, the value of the electrical resistance R1 is greater than that of the electrical resistance R2 and is configured to minimize electromagnetic noise as far as heat generation is permitted. Therefore, in comparison to the rate of variation in the control voltage through the electrical resistance R2, the rate of variation in the control voltage through the electrical resistance R1 is relatively small. Accordingly, a loss per switching is relatively large, while electromagnetic noise is suppressed to be relatively small. Additionally, the control frequency of the normal drive mode is much smaller than that of the current limit mode. That is, the number of switchings is extremely small in the normal drive mode so that heat generation is relatively small as a whole. Similarly, the switching device SW4 operates in accordance with the control matrix of TABLE 1 as well as the switching device SW3, and the description is omitted. The switching devices SW1, SW2 operate in accordance with the control matrix of the driver circuit D2 in TABLE 1, and the description is omitted.

The current limit mode will now be described. Referring back to FIG. 1, if a load circuit that needs a greater voltage than a rated voltage of the AC inverter 1 is connected to the output circuit 3, high current tends to flow at the output circuit 3 of the H bridge circuit 2. In this state, the overcurrent detector 6 outputs an overcurrent signal to the control circuit 5 to switch the drive mode of the switching devices SW3, SW4 to the current limit mode. Namely, the control frequency of the switching devices SW3, SW4 becomes approximately 40 kHz, and the control frequency of the switching devices SW1, SW2 still ranges from 60 to 50 Hz.

In the current limit mode, the control circuit 5 sends an ON-OFF control signal to the driver circuit D3 of the respective switching devices SW3, SW4, while it sends a control signal to the driver circuit D2 of the switching devices SW3, SW4 for maintaining an OFF-state of the driver circuit D2. Additionally, the control circuit 5 sends an ON-OFF control signal to the driver circuit D1 of the switching devices SW1, SW2.

The ON-OFF control signal for the current limit mode will now be described. The control circuit 5 switches the switching device SW1 to an ON-state in response to the control frequency of the normal drive mode, while it switches on and off the switching device SW4 in response to the control frequency of the current limit mode. Then, the switching devices SW2, SW3 are simultaneously switched to an OFF-state. The control circuit 5 simultaneously switches the switching devices SW1, SW4 to an OFF-state at the next period of the control frequency of the normal drive mode. Then, the control circuit 5 switches the switching device SW2 to an ON-state, while it switches on and off the switching device SW3 at the control frequency of the current limit mode.

Namely, the control circuit 5 alternately switches on and off the switching devices SW1, SW2 at 50 to 60 Hz. Meanwhile, the control circuit 5 switches on and off the switching device SW4 at approximately 40 kHz when the switching device SW1 is on, and it switches the switching device SW4 to an OFF-state when the switching device SW1 is off. Additionally, the control circuit 5 switches on and off the switching device SW3 when the switching d vice SW2 is on, and it switches the switching device SW3 to an OFF-state when the switching device SW2 is off.

The inductance of the reactor in the filter is appropriately selected in accordance with the control frequency of the switching devices SW3, SW4 in the current limit mode so as to limit output current by the reactor for preventing collapse of the circuit.

TABLE 2 shows a control matrix of the transistors Tr11, Tr12 of the driver circuit D2 and Tr21, Tr22 of the driver circuit D3 for each of the switching devices SW3, SW4.

TABLE 2

| DRIVER CIRCUIT | | D2 | | D3 | |
| --- | --- | --- | --- | --- | --- |
| TRANSISTOR | | Tr11 | Tr12 | Tr21 | Tr22 |
| SWITCHING DEVICE SW3, SW4 | ON OFF | OFF OFF | OFF OFF | ON OFF | OFF ON |

Now referring to TABLE 2 and FIG. 3, when the switching device SW3 is switched to an ON-state, the transistor Tr21 turns on while the transistor Tr22 turns off. Thus, electric charge is supplied to the control terminal of the switching device SW3 through the electrical resistance R2. When the switching device SW3 is switched to an OFF-state, the transistor Tr21 turns off while the transistor Tr22 turns on. Thus, electric charge is drawn from the control terminal of the switching device SW3 through the electrical resistance R2. The transistors Tr11, Tr12 are off in the current limit mode. Incidentally, the value of the electrical resistance R2 is smaller than that of the electrical resistance R1 and is configured to minimize h at generation as far as electromagnetic noise is permitted. Therefore, in comparison to the rate of variation in the control voltage through the electrical resistance R1, the rate of variation in the control voltage through the electrical resistance R2 is relatively large. Accordingly, electromagnetic noise upon switching is relatively large, while host generation is suppressed to be relatively small. Additionally, the application of the current limit mode is much less than that of the normal drive mode so that electromagnetic noise is relatively small as a whole. Similarly, the switching device SW4 operates in accordance with the control matrix of TABLE 2 as well as the switching device SW3, and the description is omitted. The driver circuits D1 of the switching devices SW1, SW2 operate the same in the current limit mode as in the normal drive mode, and the description is omitted.

According to the first preferred embodiment, the following advantageous effects are obtained.

(1) During the normal drive mode that operates at 50 to 60 Hz, the driver circuit D2 with the electrical resistance R1 having a relatively large resistance value drives the switching devices SW3, SW4. During the current limit mode, the driver circuit D3 with the electrical resistance R2 having a relatively small resistance value drives the switching devices SW3, SW4. Accordingly, the rate of variation in the control voltage is appropriate to the drive mode for switching so that electromagnetic noise and heat generation are suppressed. Additionally, the degree of freedom increases for designing.

(2) The push-pull circuit P1 includes the transistors Tr11, Tr12, and the push-pull circuit P2 includes the transistors Tr21, Tr22. The driver circuit D1 includes the push-pull circuit P1 and the electrical resistance R1. One terminal of the electrical resistance R1 is connected to the control terminal of the switching devices SW1 or SW2, and the other terminal is connected to the output terminal of the push-pull circuit P1. The driver circuit D2 is configured the same as the driver circuit D1. The one terminal of the electrical resistance R1 is connected to the control terminal of the switching devices SW3 or SW4, and the other terminal is connected to the output terminal of the push-pull circuit P1. The driver circuit D3 includes the push-pull circuit P2 and the electrical resistance R2, and the one terminal of the electrical resistance R2 is connected to the control terminal of the switching devices SW3 or SW4, and the other terminal is connected to the output terminal of the push-pull circuit P2. Accordingly, integration of the circuit is relatively easy.

(3) The control circuit 5 switches the drive mode in response to the control frequency. Namely, when the control frequency ranges from 50 to 60 Hz, the control circuit 5 operates in the normal drive mode in such a manner that the control circuit 5 selects the driver circuit D2 with the electrical resistance R1 having a greater resistance value for driving the switching devices SW3, SW4. Thus, electromagnetic noise is suppressed. When the control frequency is approximately 40 kHz, the control circuit 5 operates in the current limit mode in such a manner that the control circuit 5 selects the driver circuit 3 with the electrical resistance R2 having a smaller resistance value for driving the switching devices SW3, SW1. Thus, heat generation is suppressed. Accordingly, the rate of variation in the control voltage is appropriate to the control frequency for switching so that electromagnetic noise and heat generation are suppressed.

(4) The switching devices SW3, SW4 are located near the ground of the H bridge circuit 2. Accordingly, The circuit of the AC inverter 1 is easily assembled.

Figure 4:
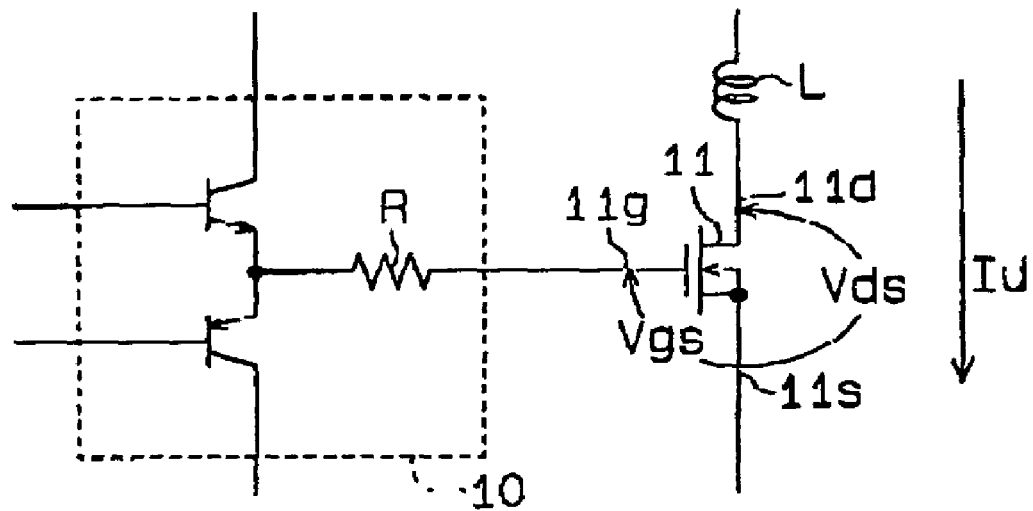
FIG. 4 is a diagram of a prior art driver circuit.

A second preferred embodiment of the present invention will now be described with reference to FIGS. 4 through 6. The same reference numerals denote the substantially identical components to those in the first preferred embodiment, and the description is omitted for the substantially identical components.

Figure 5:
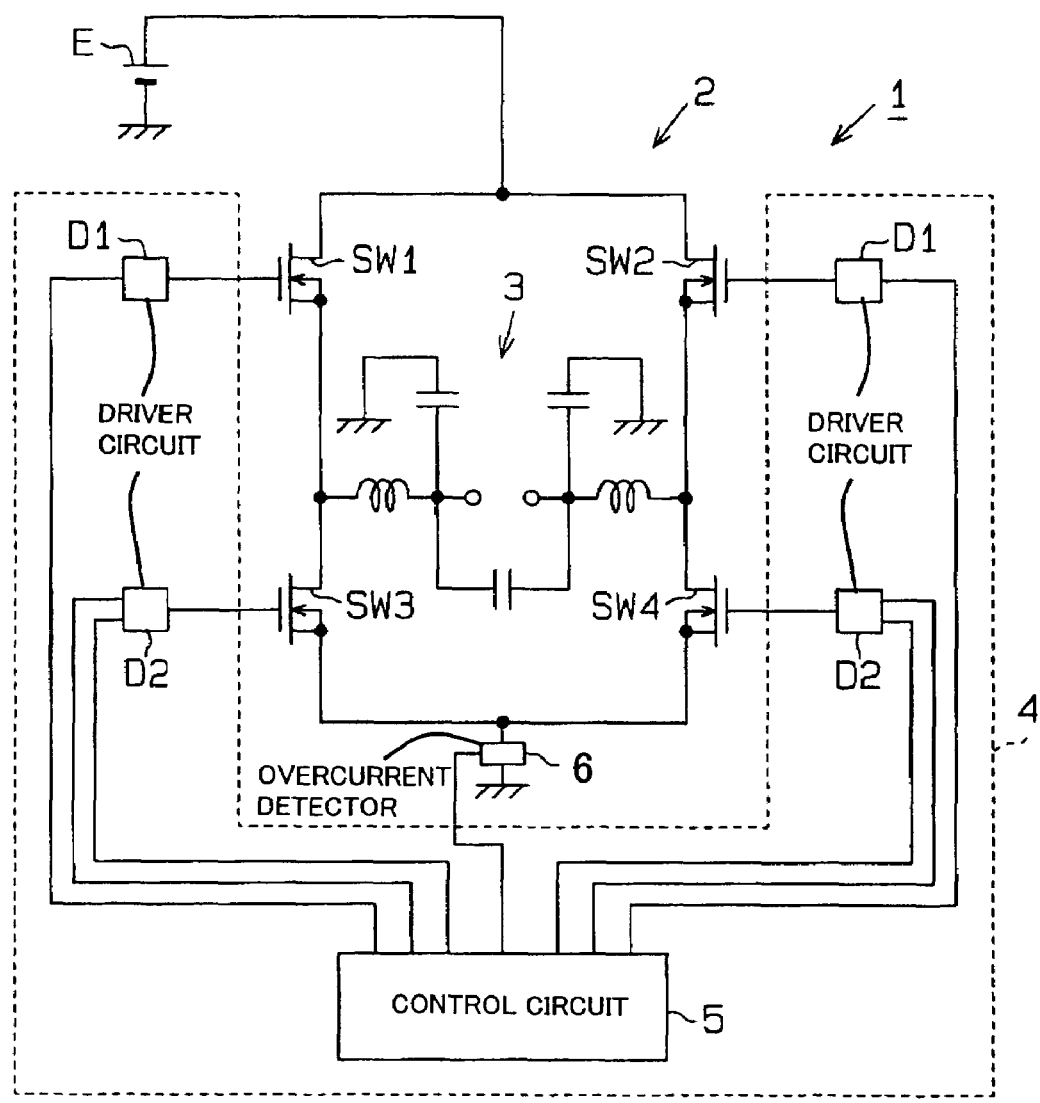
FIG. 5 is a circuit diagram of an AC inverter according to a second preferred embodiment of the present invention.

FIG. 5 illustrates a circuit diagram of an AC inverter 1A according to the second preferred embodiment of the present invention. The driver 4 includes driver circuits D1, D2 and the control circuit 5. The driver circuit D1 is connected to gates that are control terminals of the switching devices SW1, SW2. The driver circuit D2 is connected to gates that are control terminals of the switching devices SW3, SW4. The control circuit 5 is connected to the driver circuits D1, D2.

Figure 6:
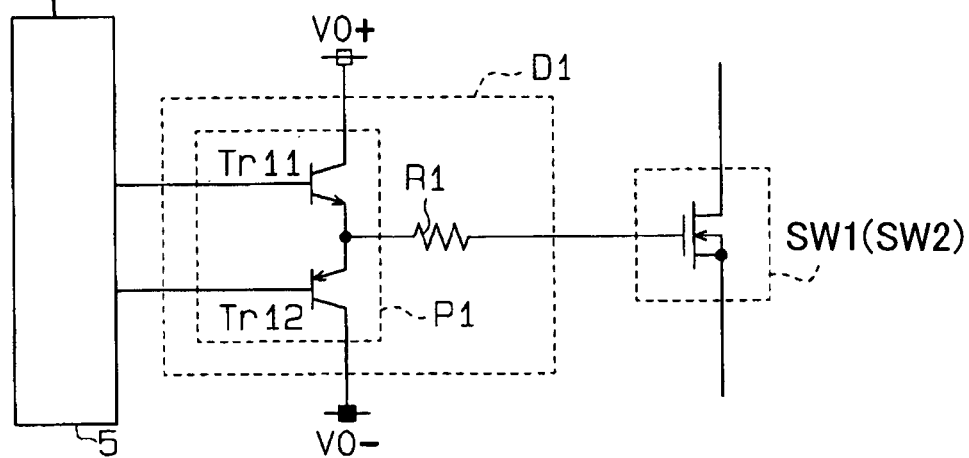
FIG. 6 is a diagram of a driver circuit for a switching device SW1 or SW2 according to the second preferred embodiment of the present invention.

FIG. 6 illustrates the driver circuit D1 for the switching devices SW1, SW2 according to the second preferred embodiment of the present invention. The driver circuit D1 includes the push-pull circuit P1 and the electrical resistance R1. A top and bottom ends of the push-pull circuit P1 are respectively connected to a positive terminal V0+ of a power source V0 and a negative terminal V0− of the power source V0. Namely, the power source V0 is connected to the top and bottom ends of the push-pull circuit P1. One terminal of the electrical resistance R1 is connected to the control terminal or the gate of the switching device SW1 or SW2, and the other terminal is connected to an output terminal of the push-pull circuit P1.

Figure 7:
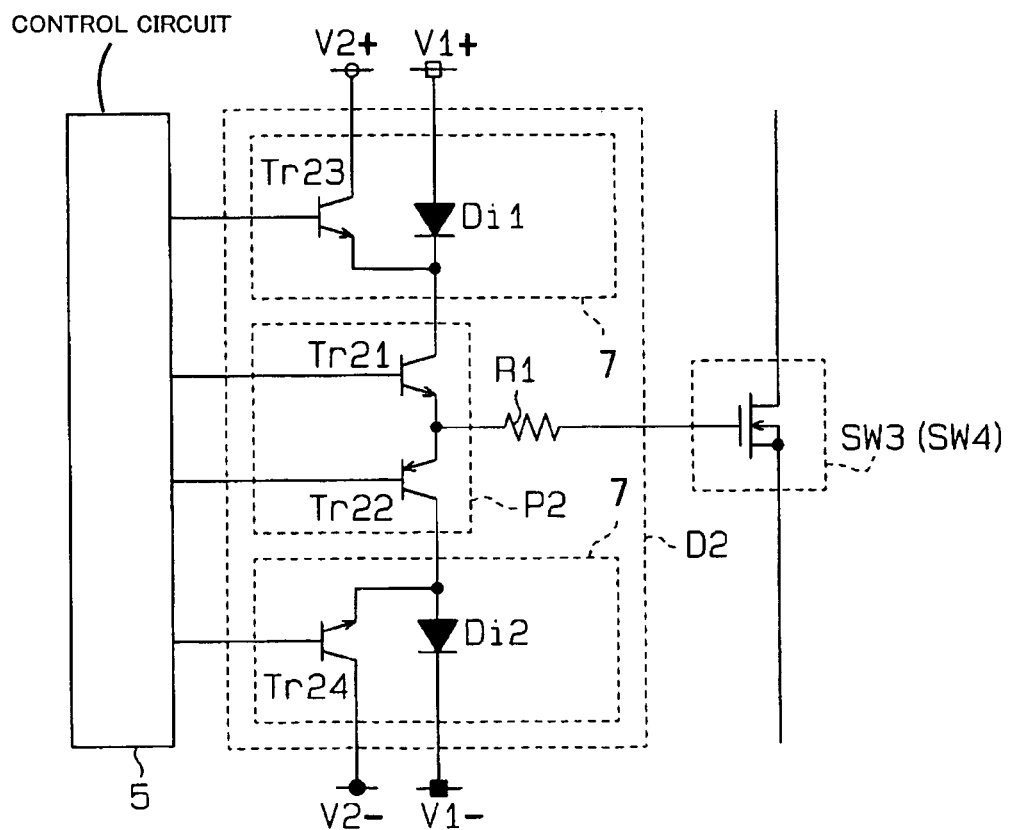
FIG. 7 is a diagram of a driver circuit for a switching device SW3 or SW4 according to the second preferred embodiment of the present invent

FIG. 7 illustrates the driver circuit D2 for the switching devices SW3, SW4 according to the second preferred embodiment of the present invention. The driver circuit D2 includes the push-pull circuit P2, the electrical resistance R1 and a power source select circuit 7. A power source V1 includes a positive terminal V1+ and a negative terminal V1−. A power source V2 includes a positive terminal V2+ and a negative terminal V2−. The top and bottom ends of the push-pull circuit P2 are connected through the power source select circuit 7 between the positive terminal V1+ and the negative terminal V1− and between the positive terminal V2+ and the negative terminal V2−. One terminal of the electrical resistance R1 is connected the control terminal of the switching device SW3 or SW4, and the other terminal is connected to the output terminal of the push-pull circuit P2.

Incidentally, the voltage of the power source V2 is larger than that of the power source V1. The positive terminal V1+ is lower in electric potential than the positive terminal V2+. The negative terminal V1− is higher in electric potential than the negative terminal V2−. In addition, the voltage of the power source V1 is configured to minimize electromagnetic noise in the normal drive made. In which the control frequency ranges from 50 to 60 Hz, as far as heat generation is permitted. The voltage of the power source V2 is configured to minimize heat generation in the current limit mode, in which the control frequency is approximately 40 kHz, as far as electromagnetic noise is permitted.

The power source select circuit 7 includes diodes Di1, Di2 and transistors Tr23, Tr24. In the diode Di1, the anode is connected to the positive terminal V1+, and the cathode is connected to the collector of the transistor Tr21. In the pnp-transistor Tr23, the emitter is connected to the positive terminal V2+, the base is connected to the control circuit 5 and the collector is connected to the collector of the transistor Tr21. In the diode Di2, the cathode is connected to the negative terminal V1−, and the anode is connected to the collector of the transistor Tr22. In the npn-transistor Tr24, the emitter is connected to the negative terminal V2−, the base is connected to the control circuit 5 and the collector is connected to the collector of the transistor Tr22.

The normal drive mode will now be described. Referring to FIG. 5, when the overcurrent detector 6 does not output an overcurrent signal to the control circuit 5, the control circuit 5 operates the driver circuits D1, D2 in the normal drive mode. In other words, the switching devices SW3, SW4 are operated at the control frequency of 50 to 60 Hz. Incidentally, the switching devices SW1, SW2 are also operated at the control frequency of 50 to 60 Hz.

In the normal drive mode, the control circuit 5 sends an ON-OFF control signal to the push-pull circuit P2 of the driver circuit D2 for the switching devices SW3, SW4 and also sends a signal for maintaining an OFF-state to the transistors Tr23, Tr24 of the power source select circuit 7 so as to select the power source V1. Additionally, the control circuit 5 sends an ON-OFF control signal to the driver circuit D1 for the switching devices SW1, SW2.

TABLE 3 shows a control matrix of the transistors Tr11, Tr12 of th driver circuit D1 for each of the switching devices SW1, SW2.

TABLE 3

| DRIVER CIRCUIT | | D1 | |
| --- | --- | --- | --- |
| TRANSISTOR | | Tr11 | Tr12 |
| SWITCHING DEVICE | ON | ON | OFF |
| SW1, SW2 | OFF | OFF | ON |

Now referring to TABLE 3 and FIG. 6, when the switching device SW1 is switched to an ON-state, the transistor Tr11 turns on while the transistor Tr12 turns off. Thus, an electric charge is supplied from the positive terminal V0+ to the control terminal of the switching device SW1. When the switching device SW1 is switched to an OFF-state, the transistor Tr11 turns off while the transistor Tr12 turns on. Thus, an electric charge is drawn from the control terminal of the switching device SW1 to the negative terminal V0−.

Similarly, the switching device SW2 operates in accordance with TABLE 3, and the description is omitted.

TABLE 4 shows a control matrix of the transistors Tr21, Tr22, Tr23, Tr24 of the driver circuit D2 for each of the switching devices SW3, SW4.

TABLE 4

| DRIVER CIRCUIT | | D2 | | | |
|---|---|---|---|---|---|
| TRANSISTOR | | Tr21 | Tr22 | Tr23 | Tr24 |
| SWITCHING DEVICE SW3, SW4 | ON OFF | OFF OFF | OFF OFF | OFF ON | OFF OFF | OFF OFF |

Now referring to TABLE 4 and FIG. 7, when the switching device SW3 is switched to an ON-state, the transistor Tr21 turns on while the transistor Tr22 turns off. Thus, electric charge is supplied from the positive terminal V1+ to the control terminal of the switching device SW3. When the switching device SW3 is switched to an OFF-state, the transistor Tr21 turns off while the transistor 22 turns on. Thus, electric charge is drawn from the control terminal of the switching device SW3 to the negative terminal V1−. The transistors Tr23, Tr24 are off in the normal drive mode.

The positive terminal V1+ is lower in electric potential than the positive terminal V2+, and the negative terminal V1− is higher in electric potential than the negative terminal V2−. Thus, the voltage of the power source V1 is configured to minimize electromagnetic noise as far as heat generation is permitted. In comparison to operation with the power source V2, the rate of variation in the control voltage is relatively small with the power source V1. Accordingly, a loss upon switching is relatively large, while electromagnetic noise is suppressed to be relatively small. Incidentally, the control frequency of the normal drive mode is much smaller than that of the current limit mode so that heat generation is relatively small as a whole. Similarly, the switching device SW4 operates in accordance with TABLE 4, and the description is omitted.

The current limit mode will now be described. Referring back to FIG. 5, if a load circuit that needs a greater voltage than a rated voltage of the AC inverter 1 is connected to the output circuit 3, high current tends to flow at the output circuit 3 of the H bridge circuit 2. In this state, the overcurrent detector 6 outputs an overcurrent signal to the control circuit 5 to switch the drive mode of the switching devices SW3, SW4 to the current limit mode. Namely, the control frequency of the switching devices SW3, SW4 becomes approximately 40 kHz, and the control frequency of the switching devices SW1, SW2 still ranges from 50 to 60 Hz.

In the current limit mode, the control circuit 5 sends an ON-OFF control signal to the push-pull circuit P2 of the driver circuit D2 for the switching devices SW3, SW4 and also sends an ON-OFF control signal to the transistors Tr23, Tr24 of the power source select circuit 7 so as to select the power source V2. Additionally, the control circuit 5 sends an ON-OFF control signal to the driver circuit D1 for the switching devices SW1, SW2.

TABLE 5 shows a control matrix of the transistors Tr21, Tr22, Tr23, Tr24 of the driver circuit D2 for the switching devices SW3, SW4.

TABLE 5

| DRIVER CIRCUIT | | D2 | | | |
|---|---|---|---|---|---|
| TRANSISTOR | | Tr21 | Tr22 | Tr23 | Tr24 |
| SWITCHING DEVICE SW3, SW4 | ON OFF | ON OFF | OFF OFF | OFF ON | ON OFF | OFF ON |

Now referring to TABLE 5 and FIG. 7, when the switching device SW3 is switched to an ON-state, the transistors Tr21, Tr23 turn on while the transistors Tr22, Tr24 turn off. Thus, an electric charge is supplied from the positive terminal V2+ to the control terminal of the switching device SW3. When the switching device SW3 is switched to an OFF-state, the transistors Tr21, Tr23 turn off while the transistors Tr22, Tr24 turn on. Thus, an electric charge is drawn from the control terminal of the switching device SW3 to the negative terminal V2−.

Incidentally, the positive terminal V2+ is higher in electric potential than the positive terminal V1+, and the negative terminal V2− is lower in electric potential than the negative terminal V1−. Thus, the voltage of the power source V2 is configured to minimize heat generation as far as electromagnetic noise is permitted. In comparison to operation with the power source V1, the rate of variation in the control voltage is relatively large with the power source V2. Accordingly, electromagnetic noise upon switching is relatively large, while heat generation is suppressed to be relatively small. Additionally, the utilization of the current limit mode is much less than that of the normal drive mode so that electromagnetic noise is relatively small as a whole. Similarly, the switching device SW4 operates in accordance with the control matrix or TABLE 5 a well as the switching device SW3, and the description is omitted. The driver circuits D1 of the switching devices SW1, SW2 operate the same in the current limit mode as in the normal drive mode, and the description is omitted.

According to the second preferred embodiment, in addition to the advantageous effect mentioned in the paragraph (4) in the first preferred embodiment, the following advantageous effects are obtained.

(5) The control circuit 5 selects the power source V1 having relatively low voltage to drive the switching devices SW3, SW4 in the normal drive mode and selects the power source V2 having relatively high voltage to drive the switching devices SW3, SW4 in the current limit mode. Namely, the amount of flowing electric charge, when the power source V1 having relatively low voltage is selected, is smaller per unit time than that when the power source V2 having relatively high voltage is selected. As a result, the rate of variation in the control voltage for the switching devices SW3, SW4 is relatively small. The amount of flowing electric charge, when th power source V2 having relatively high voltage is selected, is high r per unit time than that when the power source V1 having relatively low voltage is selected. As a result, the rate of variation in the control voltage for the switching devices SW3, SW4 is relatively large. Accordingly, the rate of variation in the control voltage is appropriate to the selected drive mode for switching so that electromagnetic noise and heat generation are suppressed. In addition, the degree of freedom increases for designing.

(6) The push-pull circuit P1 includes the transistors Tr11, Tr12. The push-pull circuit P2 includes the transistors Tr21, Tr22. The driver circuit D1 includes the push-pull circuit P1 and the electrical resistance R. One terminal of the electrical resistance R1 is connected to the control terminal, or the gate, of the switching d vice SW1 or SW2, and the other terminal is connected to the output terminal of the push-pull circuit P1. Additionally, the driver circuit D2 includes the push-pull circuit P2, the electrical resistance R1 and the power source select circuit 7. One terminal of the electrical resistance R1 is connected to the control terminal of the switching device SW3 or SW4, and the other terminal is connected to the output terminal of the push-pull circuit P2. Furthermore, the power source select circuit 7 of the driver circuit D2 includes the transistors Tr23, Tr24 and the diodes Di1, Di2. Accordingly, integration of the circuit is relatively easy.

(7) The control circuit 5 switches the drive mode in response to the control frequency. Namely, the control circuit 5 employs the normal drive mode when the control frequency ranges from 50 to 60 Hz so that the power source V1 having relatively low voltage is selected to drive the switching devices SW3, SW4. Therefore, the amount of flowing electric charge is relatively small per unit time in comparison to a state when the power source V2 having relatively high voltage is selected. As a result, the rate of variation in the control voltage for the switching devices SW3, SW4 is relatively small so that electromagnetic noise is suppressed. The control circuit 5 employs the current limit mode when the control frequency is approximately 40 kHz so that the power source V2 having relatively high voltage is selected to drive the switching devices SW3, SW4. Therefore, the amount of flowing electric charge is large per unit time in comparison to a state when the power source V1 having relatively low voltage is selected. As a result, the rate of variation in the control voltage for the switching devices SW3, SW4 is large so that heat generation is suppressed. Accordingly, the rate of variation in the control voltage is appropriate for switching so that electromagnetic noise and heat generation are suppressed.

A third preferred embodiment of the present invention will now be described with reference to FIG. 8. The structure of the driver circuit D2 is different from that of the first preferred embodiment. The same reference numerals denote the substantially identical components to those in the second embodiment, and the description is omitted.

Figure 8:
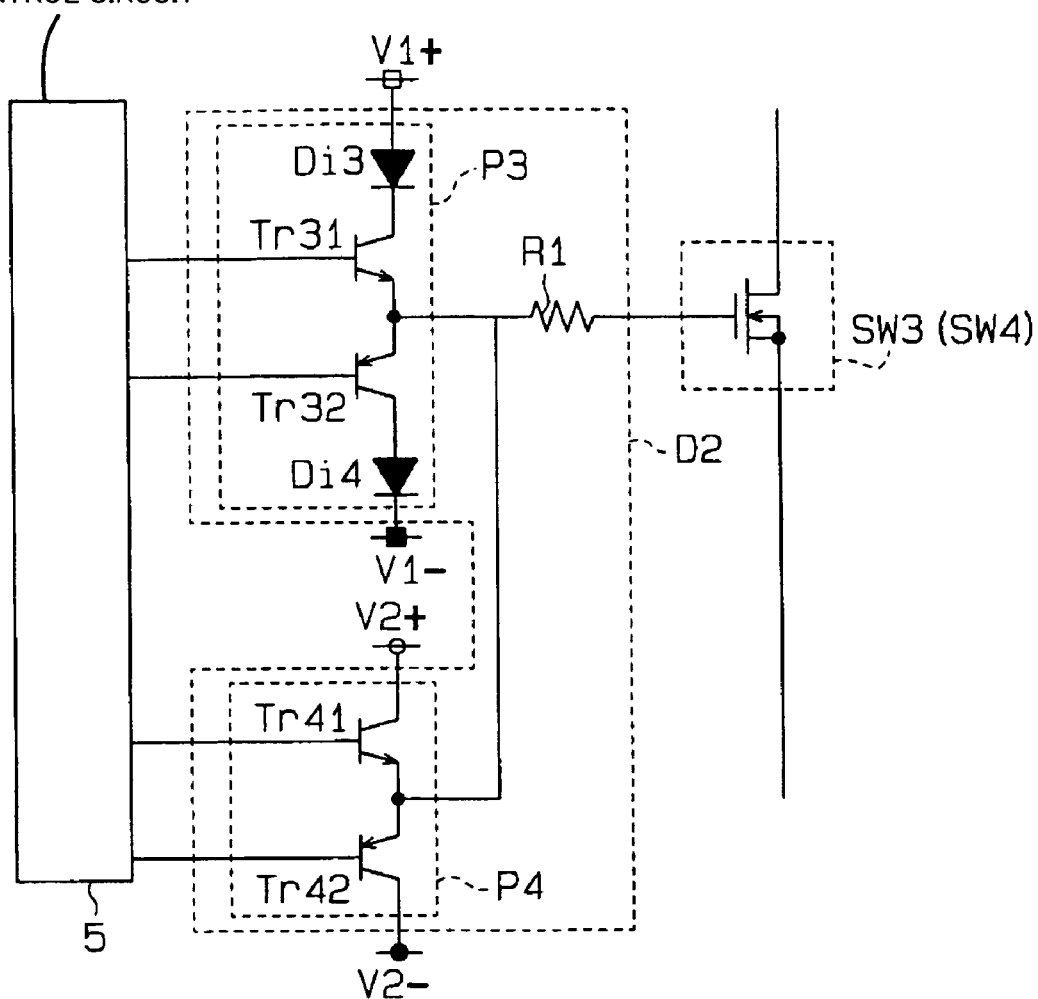
FIG. 8 is a diagram of a driver circuit for a switching device SW3 or SW4 according to a third preferred embodiment of the present invention.

FIG. 8 illustrates the driver circuit D2 for the switching devices SW3, SW4 according to the third preferred embodiment of the present invention. The driver circuit D2 includes the electrical resistance R1 and two push-pull circuits P3, P4. The same number of push-pull circuits as the power supplies V1, V2 are provided. The positive and negative terminals V1+, V1− are respectively connected to the top and bottom ends of the push-pull circuit P3. The positive and negative terminals V2+, V2− are respectively connected to the top and bottom ends of the push-pull circuit P4. One terminal of the electrical resistance R1 is connected to the control terminal of the switching devices SW3 or SW4, and the other terminal is connected to both the output terminals of the push-pull circuits P3, P4. Namely, the push-pull circuits P3, P4 are connected in parallel to the electrical resistance R1.

The push-pull circuit P3 includes an npn-transistor Tr31, a pnp-transistor Tr32, and diodes De3, Di4. The cathode of the diode Di3 is connected to the collector of the transistor Tr31. The anode of the diode Di4 is connected to the collector of the transistor Tr32. The push-pull circuit P4 includes an npn-transistor Tr41 and a pnp-transistor Tr42.

When a voltage differential is relatively large between the power supplies V1, V2 during operation of the push-pull circuit P4, electric current tends to flow from th power source V2 to the power source V1 by overcoming withstanding pressure between the emitter of the transistor Tr31 and the collector of the transistor for Tr32. The diodes Di3, Di4 prevent the above electric current flow.

The operation of the above-configured third preferred embodiment will now be described. The structure of the driver circuit D1 is identical to that of the first preferred embodiment, and the description is omitted.

In the normal drive mode, the control circuit 5 sends an ON-OFF control signal to the push-pull circuit P3 of the driver circuit D2 for the switching devices SW3, SW4 and sends a control signal for maintaining an OFF-state to the push-pull circuit P4. Thus, the power source V1 is selected.

TABLE 6 shows a control matrix of the transistors Tr31, Tr32, Tr41, Tr42 of the driver circuit D2 for switching devices SW3, SW4.

TABLE 6

| DRIVER CIRCUIT | | D2 | | | |
|---|---|---|---|---|---|
| TRANSISTOR | | Tr31 | Tr32 | Tr41 | Tr42 |
| SWITCHING DEVICE SW3, SW4 | ON OFF | ON OFF | OFF OFF | OFF ON | OFF OFF | OFF OFF |

Now referring to TABLE 6 and FIG. 8, when the switching device SW3 is switched to an ON-state, the transistor Tr31 turns on while the transistor Tr32 turns off. Thus, electric charge is supplied from the positive terminal V1+ to the control terminal of the switching device SW3. When the switching device SW3 is switched to an OFF-state, the transistor Tr31 turns off while the transistor Tr32 turns on. Thus, electric charge is drawn from the control terminal of the switching device SW3 to the negative Terminal V1−. The transistors Tr41, Tr42 are off in the normal drive mode. Similarly, the switching device SW4 operates in accordance with the control matrix of TABLE 6, and the description is omitted.

In the current limit mode, the control circuit 5 sends a control signal for maintaining an OFF-state to the push-pull circuit P3 of the driver circuit D2 for the switching devices SW3, SW4 and sends an ON-OFF control signal to the push-pull circuit P4. Thus, the power source V2 is selected.

TABLE 7 shows a control matrix of the transistors Tr31, Tr32, Tr41, Tr42 of the driver circuit D2 for the switching devices SW3, SW4.

TABLE 7

| DRIVER CIRCUIT | | D2 | | | |
|---|---|---|---|---|---|
| TRANSISTOR | | Tr31 | Tr32 | Tr41 | Tr42 |
| SWITCHING DEVICE SW3, SW4 | ON OFF | OFF OFF | OFF OFF | ON OFF | OFF ON |

Now referring to TABLE 7 and FIG. 8, when the switching device SW3 is switched to an ON-state, the transistor Tr41 turns on while the transistor Tr42 turns off. Thus, electric charge is supplied from the positive terminal V2+ to the control terminal of the switching device SW3. When the switching device SW3 is switched to an OFF-state, the transistor Tr41 turns off while the transistor Tr42 turns on. Thus, electric charge is drawn from the control terminal of the switching device SW3 to the negative terminal V2−. The transistors Tr31, Tr32 are off in the current limit mode. The switching device SW4 operates in accordance with the control matrix of the TABLE 7, and the description is omitted.

According to the third preferred embodiment, in addition to the above-mentioned paragraphs (4), (5) and (7) in the first and second preferred embodiments, the following advantageous effects are obtained.

(9) The push-pull circuits P3, P4 are connected in parallel with each other so that the circuit is relatively simple.

The present invention is not limited to the embodiments described above but may be modified into the following alternative embodiments.

In alternative embodiments to the above preferred embodiments, the value of the electrical resistance R1 of the driver circuit D1 is not limited to the same as that of the electrical resistance R1 of the driver circuit D2. As far as heat generation is permitted in the normal drive mode, any resistance value that suppresses electromagnetic noise is applicable.

In alternative embodiments to the above preferred embodiments, the driver circuit for driving the switching devices SW1, SW2 that only operate in the normal drive mode is not limited to the push-pull circuit.

Figure 9A:
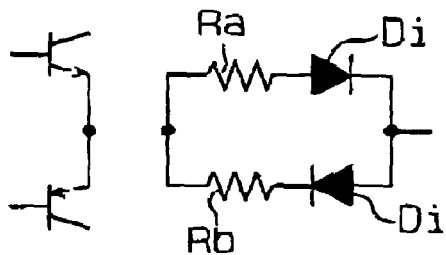
FIG. 9A is a diagram of electrical resistances that are connected to a driver circuit according to an alternative embodiment of the present invention.
Figure 9B:
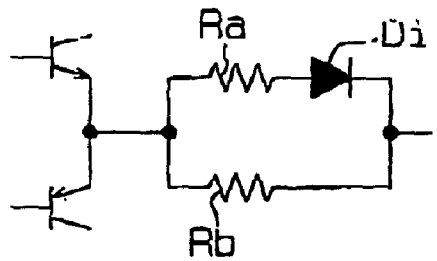
FIG. 9B is a diagram of electrical resistances that are connected to a driver circuit according to an alternative embodiment of the present invention.
Figure 9C:
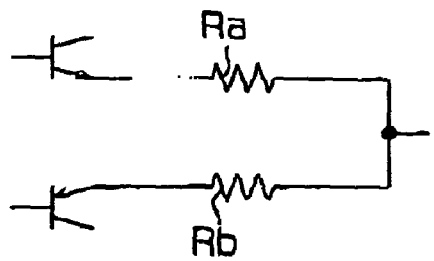
FIG. 9C is a diagram of electrical resistances that are connected to a driver circuit according to an alternative embodiment of the present invention.
Figure 10:
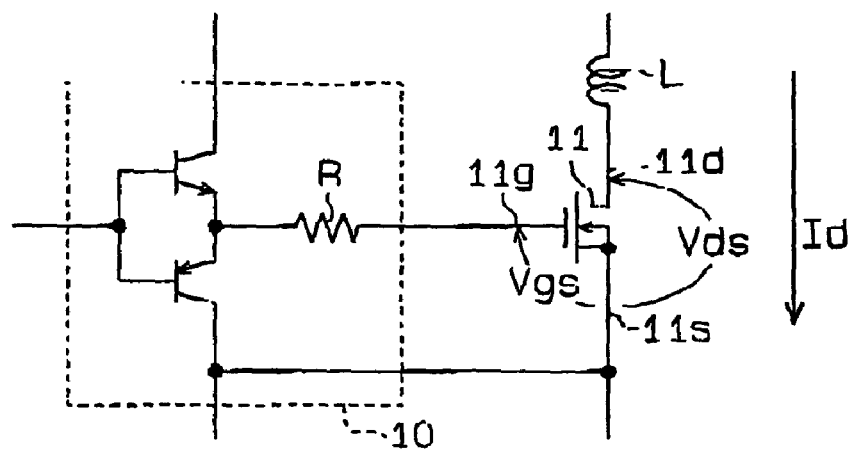
FIG. 10 is a diagram of a prior art driver circuit.

In alternative embodiments to the above preferred embodiments, the number of electrical resistances in a single switching device is not limited to one. For example, referring to FIG. 9A, the diagram illustrates electrical resistances Ra, Rb that are connected to a driver circuit. The two electrical resistances Ra, Rb having different resistance values are connected in parallel through diodes Di, respectively. The anode of the diode Di is connected on the side of the push-pull circuit to the electrical resistance Ra for switching the switching device to an ON-state, while the cathode of the diode Di is connected on the side of the push-pull circuit to the electrical resistance Rb for switching the switching device to an OFF-state. Furthermore, referring to FIG. 9B, the diagram illustrates electrical resistances Ra, Rb that are connected to a driver circuit according to an alternative embodiment of the present invention. The two electrical resistances Ra, Rb are connected in parallel, and the diode Di is connected to one of the electrical resistances Ra, Rb. Also, referring to FIG. 9C, the diagram illustrates electrical resistances Ra, Rb that are connected to a driver circuit according to an alternative embodiment of the present invention. The two electrical resistances Ra, Rb are connected as shown in the drawing by devising the control circuit 5.

In alternative embodiments to the above first preferred embodiment, the driver circuits D2, D3 are selected for driving the switching devices SW3, SW4 in the current limit mode. In this state, the value of electrical resistance R2 is configured to minimize heat generation in the current limit mode as far as electromagnetic noise is permitted while the electrical resistances R1, R2 are connected in parallel.

TABLE 8 shows a control matrix of the transistors Tr11, Tr12, Tr21, Tr22.

TABLE 8

| DRIVER CIRCUIT | | D2 | | D3 | |
|---|---|---|---|---|---|
| TRANSISTOR | | Tr11 | Tr12 | Tr21 | Tr22 |
| SWITCHING DEVICE | ON | ON | OFF | ON | OFF |
| SW3, SW4 | OFF | OFF | OFF | ON | OFF | ON |

In alternative embodiments to the above first preferred embodiment, the values of the electrical resistances R1, R2 need not be different. The driver circuits D2, D3 with the respective electrical resistances R1, R2 having the same resistance value are selected for driving the switching devices SW3, SW4 in the current limit mode. In this state, the values of the electrical resistances R1, R2 are configured to minimize electromagnetic noise in the normal drive mode as far as heat generation is permitted, and to minimize heat generation in the current limit mode as far as electromagnetic noise is permitted while the electrical resistances R1, R2 are connected in parallel. Accordingly, the electrical resistances do not need to be different so that the circuit is easily manufactured.

In alternative embodiments to the above first preferred embodiment, the number of drive modes is not limited to two. For example, the driver circuits D2, D3 with the respective electrical resistance R1, R2 having different resistance values are employed as a driver circuit. The driver circuits D2, D3 are operated in three types of drive modes. The driver circuit D2 is only operated in one drive mode. The driver circuit D3 is only operated in another drive mode. Both of the driver circuits D2, D3 are operated in the other drive mode. When the number of drive modes is three or more, the control matrix is changed in accordance with the number of drive modes. In this state, in addition to the number of drive modes, types of electrical resistance connected to each driver circuit and the number of circuits operated in each drive mode may be changed so that the degree of freedom further increases for designing the circuit.

In alternative embodiments to the above first preferred embodiment, three or more driver circuits are connected in parallel to each switching device. For example, three driver circuits respectively have electrical resistances having different resistance values. The only one driver circuit is operated in some drive modes, or a plurality of the driver circuits is simultaneously operated in other drive modes. When the four or more driver circuits respectively have electrical resistances having different resistance values, the control matrix is changed in accordance with the number of driver circuits. In this state, in addition to the number of driver circuits, the number of drive modes, types of electrical resistance connected to each driver circuit and the number of circuits operated in each drive mode may be changed so that the degree of freedom further increases for designing the circuit.

In alternative embodiments to the above preferred embodiments, the switching device need not be made of MOSFET. For example, IGBT and bipolar transistor are applicable.

In alternative embodiments to the above preferred embodiments, the driver is not limited for use with the H bridge circuit of the AC inverter. For example, a power source unit including a switching device may employ the driver. Furthermore, a driver including a switching device for performing a chopping control of a motor may employ the driver.

In alternative embodiments to the above preferred embodiments, the drive mode need not be selected in response to control frequency. For example, when applied to a switching device for performing a chopping control that optionally varies the rotational speed of a motor, the drive mode is manually selected in accordance with the rotational speed of the motor.

In alternative embodiments to the first preferred embodiment, the switching devices SW3, SW4 connected to a plurality of the driver circuits are not limited to the switching devices on the side of the ground in the H bridge circuit 2. For example, a plurality of driver circuits is connected to the switching devices SW1, SW2 connected to the side of the positive terminal of the direct current power source E, while a driver circuit is connected to the respective switching devices SW3, SW4. Furthermore, a plurality of the driver circuits is connected to the respective switching devices SW1, SW2, SW3, SW4.

In alternative embodiments to the above second preferred embodiment, the control circuit 5 sends a control signal for maintaining an ON-state to the transistors Tr23, Tr24 in the current limit mode. In this state, the control circuit 5 operates in accordance with TABLE 9 instead of TABLE 5.

TABLE 9 shows a control matrix of the transistors Tr21, Tr22, Tr23, Tr24 of the driver circuit D2 for the switching devices SW3, SW4.

TABLE 9

| DRIVER CIRCUIT | D2 | | | |
|---|---|---|---|---|
| TRANSISTOR | Tr21 | Tr22 | Tr23 | Tr24 |
| SWITCHING DEVICE SW3, SW4 | ON OFF | ON OFF | OFF ON | ON ON | ON ON |

In alternative embodiments to the above second and third preferred embodiments, the number of drive modes is not limited to two. For example, with three drive modes, three power supplies having different electric voltage are connected to the driver circuit D2, and one of the power supplies is selected in accordance with the drive mode. When the number of drive modes is four or more, the number of power supplies, the number of power source select circuits, the number of push-pull circuits and the control matrix are changed in accordance with the number of drive modes. Accordingly, the degree of freedom further increases for designing the circuit.

In alternative embodiments to the above second and third preferred embodiments, the switching devices SW3, SW4 connected to a plurality of power supplies having different electric voltage are not limited to the switching device connected on the side of the ground in the H bridge circuit 2. For example, the driver circuit D2 including a plurality of the power supplies is respectively connected to the switching devices SW1, SW2 that are connected to the positive terminal of the direct current power source E, while the driver circuit D1 including one power source is respectively connected to the switching devices SW3, SW4. Furthermore, the driver circuit D2 including a plurality of the power supplies is respectively connected to the switching devices SW1, SW2, SW3, SW4.

Therefore, the present examples and embodiments are to be considered as illustrative and not restrictive, and the invention is not to be limited to the details given herein but may be modified within the scope of the appended claims.

What is claimed is:

1. A driver for a switching device, comprising:
   a plurality of driver circuits for driving the switching device; and
   a control circuit selectively operating at least one of the plurality of driver circuits in response to a selected one of a plurality of drive modes each requiring a different control frequency,
   wherein each of the driver circuits includes a push-pull circuit and an electrical resistor, one terminal of the electrical resistor being connected to a control terminal of the switching device, the other terminal of the electrical resistor being connected to an output terminal of the push-pull circuit, and the electrical resistances of the electrical resistors of respective driver circuits have different values so that the resistance value of the electrical resistor connected to the switching device varies according to the selected drive mode.

2. The driver according to claim 1, wherein one of the driver circuits is operated in response to the drive modes.

3. The driver according to claim 1, wherein the switching device is a component of an H bridge circuit, the drive modes including a normal drive mode and a current limit mode.

4. The driver according to claim 3, wherein the switching device is configured for a ground side in the H bridge circuit.

5. The driver according to claim 3, wherein the normal drive mode is operated in a commercial alternating-current frequency, the current limit mode being operated in a frequency that is at least one hundred times as high as the commercial alternating-current frequency.

6. A driver for a switching device, comprising:
   a plurality of driver circuits each having an electrical resistor connected to the switching device for driving the switching device; and
   a control circuit selectively operating at least one of the plurality of driver circuits in response to a selected one of a plurality of predetermined drive modes,
   wherein the switching device is selectively driven in a plurality of control frequencies, the drive modes being selected in response to the selected control frequency so that the resistance value of the electrical resistor connected to the switching device varies according to the selected drive mode.

7. The driver according to claim 6, wherein each of the driver circuits includes a push-pull circuit, one terminal of the electrical resistance being connected to a control terminal of the switching device, the other terminal of the electrical resistance being connected to an output terminal of the push-pull circuit.

8. The driver according to claim 7, wherein the electrical resistors of the respective driver circuits have different values, one of the driver circuits being operated in response to the drive modes.

9. The driver according to claim 6, wherein the number of operated driver circuits is varied in response to the drive modes.

10. The driver according to claim 9, wherein the electrical resistances resistors having same values.

11. The driver according to claim 9, wherein the number of driver circuits is two, and the electrical resistors having same values.

12. The driver according to claim 6, wherein the switching device is a component of an H bridge circuit, the drive modes including a normal drive mode and a current limit mode.

13. The driver according to claim 12, wherein the switching device is configured for a ground side in the H bridge circuit.

14. The driver according to claim 12, wherein the normal drive mode is operated in a commercial alternating-current frequency, the current limit mode being operated in a frequency that is at least one hundred times as high as the commercial alternating-current frequency.

15. A driver for a switching device, comprising:
   a plurality of driver circuits for driving the switching device, wherein each of the driver circuits includes a push-pull circuit connected to an electrical resistor, one terminal of the electrical resistor being connected to the control terminal of the switching device, the other terminal of the electrical resistor being connected to an output terminal of the push-pull circuit; and a control circuit selectively operating at least one of the plurality of driver circuits in response to a selected one of a plurality of drive modes each requiring a different control frequency, wherein the number of operated driver circuits is varied in response to the selected one of a plurality of predetermined drive modes so that the resistance value of the electrical resistor connected to the switching device varies according to the selected drive mode.

16. The driver according to claim 15, wherein one of the driver circuits is operated in response to the drive modes.

17. The driver according to claim 15, wherein each of the plurality of driver circuits includes an electrical resistor, the electrical resistances of the electrical resistors of respective driver circuits having same values.

18. The driver according to claim 15, wherein the number of driver circuits is two, each of the two driver circuits including an electrical resistor, the electrical resistances of the two electrical resistors having same values.

19. The driver according to claim 15, wherein the switching device is selectively driven in a plurality of control frequencies, the drive modes being selected in response to the selected control frequency.

20. The driver according to claim 19, wherein the switching device is a component of an H bridge circuit, the drive modes including a normal drive mode and a current limit mode.

21. The driver according to claim 20, wherein the switching device is configured for a ground side in the H bridge circuit.

22. The driver according to claim 20, wherein the normal drive mode is operated in a commercial alternating-current frequency, the current limit mode being operated in a frequency that is at least one hundred times as high as the commercial alternating-current frequency.

* * * * *